(12) United States Patent
Lee

(10) Patent No.: US 9,318,203 B2
(45) Date of Patent: Apr. 19, 2016

(54) SEMICONDUCTOR DEVICE BEING CAPABLE OF IMPROVING PROGRAM SPEED AND PROGRAM DISTURBANCE CHARACTERISTICS

(71) Applicant: SK hynix Inc., Icheon-si Gyeonggi-do (KR)

(72) Inventor: Hye Lyoung Lee, Suwon-si (KR)

(73) Assignee: SK HYNIX INC., Icheon-Si, Gyeonggi (KR)

( * ) Notice: Subject to any disclaimer, the term of this patent is extended or adjusted under 35 U.S.C. 154(b) by 16 days.

(21) Appl. No.: 14/326,047

(22) Filed: Jul. 8, 2014

(65) Prior Publication Data

US 2015/0221374 A1  Aug. 6, 2015

(30) Foreign Application Priority Data

Feb. 3, 2014 (KR) .................. 10-2014-0012202

(51) Int. Cl.
*G11C 16/10* (2006.01)
*G11C 16/04* (2006.01)

(52) U.S. Cl.
CPC ............ *G11C 16/10* (2013.01); *G11C 16/0483* (2013.01)

(58) Field of Classification Search
CPC ...................... G11C 16/10; G11C 16/0483
See application file for complete search history.

(56) References Cited

U.S. PATENT DOCUMENTS

| 6,243,290 | B1 * | 6/2001 | Kurata | G11C 11/5621 365/185.03 |
| 7,023,737 | B1 * | 4/2006 | Wan | G11C 11/5628 365/185.22 |
| 7,206,235 | B1 * | 4/2007 | Lutze | G11C 7/02 365/185.02 |
| 2005/0162916 | A1 * | 7/2005 | Guterman | G11C 11/5628 365/185.22 |
| 2006/0104120 | A1 * | 5/2006 | Hemink | G11C 11/5628 365/185.28 |
| 2007/0153594 | A1 * | 7/2007 | Chen | G11C 11/5628 365/195 |
| 2008/0205148 | A1 * | 8/2008 | Kanda | G11C 11/5621 365/185.17 |
| 2008/0310222 | A1 * | 12/2008 | Roohparvar | G11C 11/5621 365/185.03 |
| 2012/0140566 | A1 * | 6/2012 | Aritome | G11C 11/5628 365/185.19 |
| 2013/0033938 | A1 * | 2/2013 | Park | G11C 11/5628 365/185.22 |
| 2014/0063968 | A1 * | 3/2014 | Shim | G11C 16/0483 365/185.22 |
| 2014/0340964 | A1 * | 11/2014 | Shiino | G11C 11/5628 365/185.03 |

FOREIGN PATENT DOCUMENTS

| KR | 1020100043935 A | 4/2010 |
| KR | 1020130072083 A | 7/2013 |

* cited by examiner

*Primary Examiner* — J. H. Hur
(74) *Attorney, Agent, or Firm* — William Park & Associates Ltd.

(57) ABSTRACT

A semiconductor device includes memory cells electrically coupled to word lines. In addition, the semiconductor device includes an operation circuit performing a program loop on memory cells electrically coupled to a selected word line. Further, the operation circuit increases a program permission voltage applied to a bit line of a program target memory cell when a number of times in which the program loop is performed exceeds a reference number.

14 Claims, 7 Drawing Sheets

US 9,318,203 B2

SEMICONDUCTOR DEVICE BEING CAPABLE OF IMPROVING PROGRAM SPEED AND PROGRAM DISTURBANCE CHARACTERISTICS

CROSS-REFERENCE TO RELATED APPLICATION

The present application claims priority to Korean patent application number 10-2014-0012202 filed on Feb. 3, 2014, in the Korean Intellectual Property Office, the entire disclosure of which is incorporated by reference herein.

BACKGROUND

1. Technical Field

Various embodiments relate generally to a semiconductor device and, more particularly, to a semiconductor device including a memory cell.

2. Related Art

Due to structural properties of a three-dimensional NAND flash memory device to use a poly channel, when a program voltage is applied to a word line, an electron-hole pair may be easily formed by band-to-band tunneling between the word line and another word line adjacent thereto. The formed hole may be charged to the bottom of a drain select line (DSL) due to structural properties, i.e., a floating body, to deteriorate off characteristics of a drain select transistor.

SUMMARY

A semiconductor device according to an embodiment of the invention may include memory cells electrically coupled to word lines. The semiconductor device may also include an operation circuit suitable for performing a program loop on memory cells electrically coupled to a selected word line. Further, the operation circuit is suitable for increasing a program permission voltage applied to a bit line of a program target memory cell when a number of times in which the program loop is performed exceeds a reference number.

A semiconductor device according to an embodiment of the invention may include a memory block including memory strings having a three-dimensional structure. Each of the memory strings includes a drain select transistor, memory cells and a source select transistor electrically coupled in a vertical direction between a bit line and a common source line. The semiconductor device may also include an operation circuit suitable for performing a program loop on selected memory cells. The operation circuit may also be suitable for increasing a program permission voltage applied to the bit line of a program target memory cell when a number of times the program loop is performed exceeds a reference number.

DETAILED DESCRIPTION

Hereinafter, various embodiments will be described in detail with reference to the accompanying figures. The figures are provided to allow those with ordinary skill in the art to understand the scope of the embodiments of the invention. The invention may, however, be embodied in different forms and should not be construed as limited to the embodiments set forth. Rather, these embodiments are provided so that this disclosure will be thorough and complete. In addition, the embodiments are provided to fully convey the scope of the invention to those skilled in the art. Due to deterioration of the off characteristics, a diffusion current applied from a bit line may cause a channel potential and a channel boosting level to be reduced. As a result, program disturbance characteristics may be deteriorated. In a memory block, a program permission voltage of, for example, 0V may be applied to a bit line of a memory string selected to perform a program operation on, and a ground voltage of, for example, 0V may be applied to a drain select line (DSL) of a neighboring memory string sharing the bit line with the selected memory string. In other words, a voltage of 0V may be applied to both a gate and a drain of a drain select line included in the neighboring memory string sharing the bit line. Accordingly, a drain select transistor may have poor off characteristics. As such, various embodiments relate to a semiconductor device capable of improving operating characteristics.

Furthermore, 'connected/coupled' represents that one component is directly electrically coupled to another component or indirectly electrically coupled through another component. A singular form may include a plural form as long as it is not specifically mentioned in a sentence. Furthermore, 'include/comprise' or 'including/comprising' used in the specification represents that one or more components, steps, operations, and elements exists or have been added.

Figure 1:
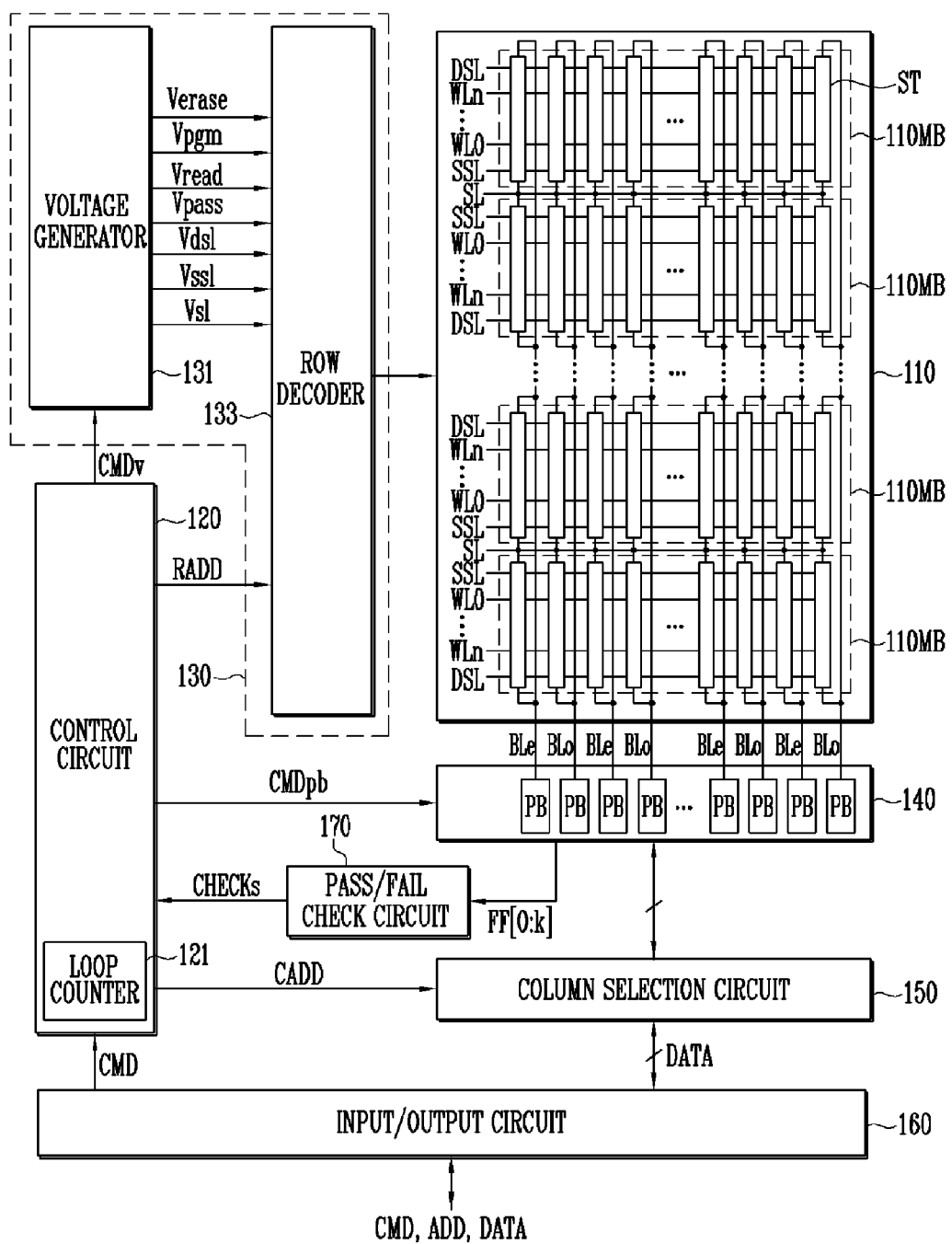
FIG. 1 is a diagram illustrating a semiconductor device according to an embodiment of the invention.
Figure 2:
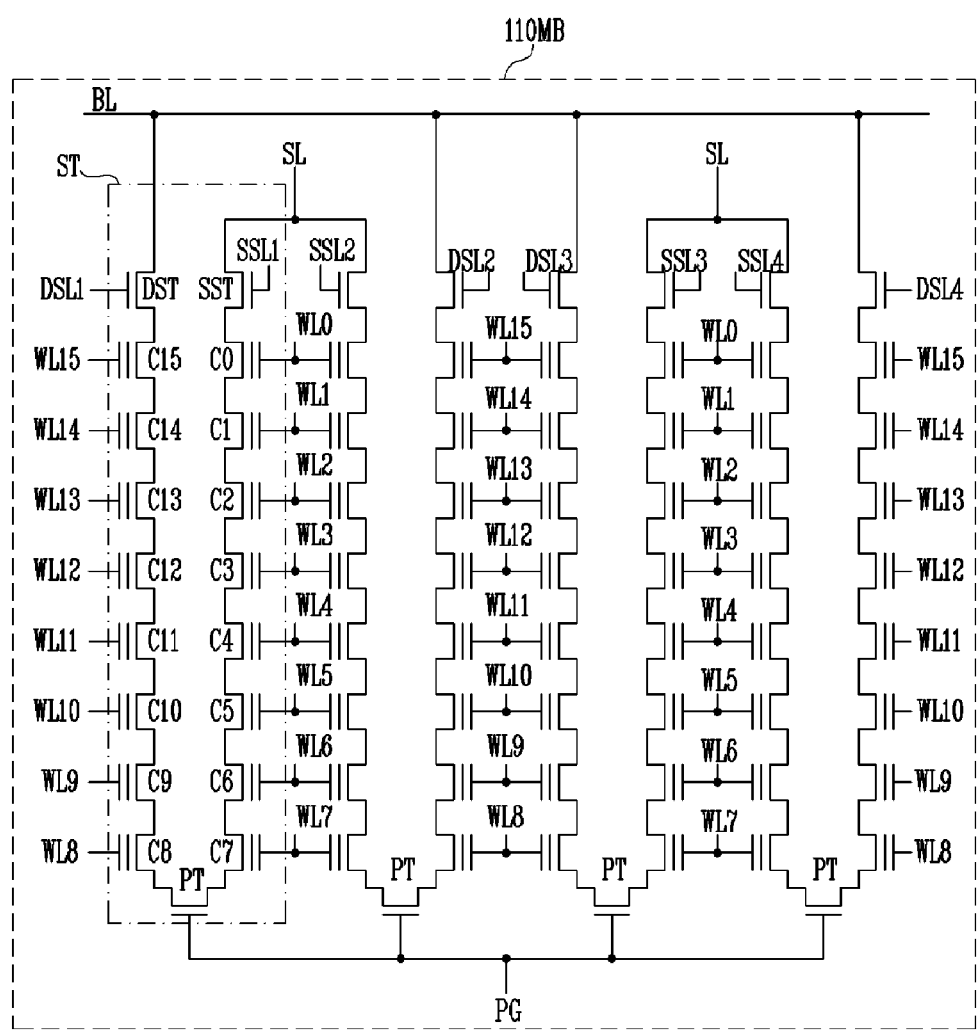
FIG. 2 is circuit diagrams illustrating a memory block shown in FIG. 1.

Referring to FIG. 1, a view illustrating a semiconductor device according to an embodiment of the invention is illustrated. Referring to FIG. 2, a circuit diagram illustrating a memory block illustrated in FIG. 1 is shown.

Referring to again FIG. 1, a semiconductor device according to an embodiment may include a memory array 110 and an operation circuit (120 to 170).

The memory array 110 may include a plurality of memory blocks 110MB. The structure of any one of the memory blocks 110MB is described below in detail.

Referring again to FIG. 2, each of the memory blocks 110MB, which are three-dimensional memory blocks, may include memory strings ST having a three-dimensional structure. The memory strings ST may be electrically coupled between a bit line BL and a common source line SL. Each of the memory strings ST may include a drain select transistor, the memory cells and a source select transistor that are electrically coupled in a vertical direction between the bit line BL and the common source line SL. Each of the memory strings ST having a P-BiCS structure may include a first memory string (SST and C0 to C7) electrically coupled in the vertical direction between the common source line SL and a pipe transistor PT of a substrate. Further, the memory strings ST having a P-BiCS structure may have a second memory string (C8 to C15 and DST) electrically coupled in the vertical direction between the bit line BL and the pipe transistor PT of the substrate. The first memory string (SST and C0 to C7) may include a source select transistor SST and also memory cells C0 to C7. The source select transistor SST may be controlled by a voltage applied to a source select line SSL1. FIG. 2 also illustrates source select lines SSL2 to SSL4. The memory cells C0 to C7 may be controlled by a voltage applied to word lines WL0 to WL7 that are stacked one each other. The second memory string (C8 to C15 and DST) may include a drain select transistor DST and memory cells C8 to C15. The drain select transistor DST may be controlled by a voltage that is applied to a drain select line DSL1. The memory cells C8 to C15 may be controlled by a voltage applied to word lines WL8 to WL15.

When the memory block 110MB is selected, the pipe transistor PT electrically coupled between a pair of memory cells C7 and C8 located in the middle of the memory string having the P-BiCS structure may electrically couple channel layers of the first memory string (SST and C0 to C7) and channel layers of the second memory string (C8 to C15 and DST) included in the selected memory block 110MB.

In a memory block having a 2D structure, each of the memory strings may be electrically coupled to each of the bit lines. In addition, drain select transistors of a memory block may be controlled at the same time by a single drain select line. However, in the memory block 110MB having a 3D structure, the plurality of memory strings ST may be electrically coupled in common to each of the bit lines BL having the 3D structure. Further, in the same memory block 110MB, the number of memory strings ST electrically coupled in common to a single bit line BL and controlled by the same word lines may vary depending on a design purpose.

Since the plurality of memory strings are electrically coupled in parallel to the single bit line BL, the drain select transistors DST may be independently controlled by select voltages applied to drain select lines DSL1 to DSL4 to selectively electrically couple the bit line BL to the memory strings ST.

The memory cells C0 to C7 of the first memory string (SST and C0 to C7) and the memory cells C8 to C15 of the second memory string (C8 to C15 and DST) electrically coupled in the vertical direction in the memory block 110MB may be controlled by operating voltages. The operating voltages may be applied to the stacked word lines WL0 to WL7 and the stacked word lines WL8 to WL15, respectively. The word lines WL0 to WL15 may be divided in memory block units.

Referring again to FIG. 1, the operation circuit (120 to 170) may perform a program loop, an erase loop and a read operation on memory cells electrically coupled to a selected word line. A word line may be, for example, the word line WL0. The program loop may include a program operation and a verify operation. The erase loop may include an erase operation and a verify operation. To perform the program loop, the erase loop and the read operation, the operation circuit (120 to 170) may selectively output operating voltages Verase, Vpgm, Vread, Vpass, Vdsl, Vssl and Vsl to local lines SSL, WL0 to WLn, and DSL of the selected memory block and the common source line SL, control precharge/discharge of bit lines Ble and BLo. The operation circuit 120 to 170 may also sense a current flow through the bit lines Ble and BLo.

In a NAND flash memory device, the operation circuit may include a control circuit 120, a voltage supply circuit 130, a read/write circuit 140, a column selection circuit 150, an input/output circuit 160 and a pass/fail check circuit 170.

The control circuit 120 may output a voltage control signal CMDv to control the voltage supply circuit 130 to generate the operating voltages Verase, Vpgm, Vread, Vpass, Vdsl, Vssl and Vsl to perform a program loop, an erase loop and a read operation at desired levels in response to a command signal CMD. The command signal CMD may be input from an external device through the input/output circuit 160. In addition, the control circuit 120 may output control signals CMDpb to control circuits PB included in the read/write circuit 140 to perform a program loop, an erase loop and a read operation. In addition, when an address signal ADD is input, the control circuit 120 may output a column address signal CADD and a row address signal RADD in response to the address signal ADD.

The control circuit 120 may include a loop counter 121. The loop counter 121 may count the number of times a program loop or an erase loop is performed. More specifically, the loop counter 121 may count the number of times a program operation is performed until a threshold voltage of a memory cell increases to a target level by performing the program operation. Further, the loop counter 121 may count the number of times an erase operation is repeated until the threshold voltage of the memory cell decreases to a target level by the erase operation.

The voltage supply circuit 130 may be configured to generate the operating voltages Verase, Vpgm, Vread, Vpass, Vdsl, Vssl and Vsl to perform the program loop, the erase loop and the read operation on the memory cells in response to the voltage control signal CMDv from the control circuit 120. The voltage supply circuit 130 may be configured to output the operating voltages to the local lines SSL, WL0 to WLn, and DSL of the selected memory block and the common source line SL in response to the row address signal RADD. The row address signal RADD may be output from the control circuit 120.

The voltage supply circuit 130 may include a voltage generator 131 and a row decoder 133. The voltage generator 131 may be configured to generate the operating voltages Verase, Vpgm, Vread, Vpass, Vdsl, Vssl and Vsl in response to the voltage control signal CMDv from the control circuit 120. The row decoder 133 may be configured to transfer the operating voltages to the local lines SSL, WL0 to WLn, and DSL of the selected memory block, among the memory blocks 110MB, and the common source line SL in response to the row address signal RADD. The row address signal RADD may be output from the control circuit 120.

The voltage supply circuit 130 may output and change the operating voltages Verase, Vpgm, Vread, Vpass, Vdsl, Vssl and Vsl to be described in response to the voltage control signal CMDv. The voltage control signal CMDv may be output from the control circuit 120.

The read/write circuit 140 may include a plurality of page buffers PB electrically coupled to the memory array 110 through the bit lines Ble and BLo. Each of the page buffers PB may be electrically coupled to each of the bit lines Ble or BLo. More specifically, a single page buffer PB may be electrically coupled to a single bit line Ble or BLo. During the program operation, in response to the PB control signal CMDpb from the control circuit 120 and data DATA to be stored in the memory cells, the page buffers PB may be configured to selectively precharge the bit lines Ble and BLo. During a program verify operation or a read operation, the page buffers PB may be configured to precharge the bit lines Ble and BLo, sense a voltage variation or current of the bit lines Ble and BLo, and latch data read out from the memory cells in response to PB control signals PB_CONTROLs of the control circuit 120. The page buffers PB may be configured to output a verify result FF[0:k] to the pass/fail check circuit 170 on the basis of the data latched during the verify operation.

The column selection circuit 150 may be configured to select the page buffers PB, included in the read/write circuit 140, in response to the column address CADD output from the control circuit 120. In other words, the column selection circuit 150 may be configured to sequentially transfer data to be stored in the memory cells to the page buffers PB in response to the column address CADD. In addition, the column selection circuit 150 may be configured to sequentially select the page buffers PB in response to the column address CADD to externally output the data of the memory cells latched to the page buffers PB during the read operation.

The input/output circuit 160 may be configured to transfer the control circuit 120 to the command signal CMD and the address signal ADD input from the external device. In addition, the input/output circuit 160 may be configured to transfer the externally input data DATA to the column selection circuit 150 during the program operation or externally output the data read out from the memory cells during the read operation.

The pass/fail check circuit 170 may be configured to determine program pass/fail by sensing the amount of current varying depending on the verify result FF[0:k] output from the page buffers PB after the program verify operation. The pass/fail check circuit 170 may be configured to output a pass/fail result signal CHECKs for determining program pass/fail according to the verify result FF[0:k] to the control circuit 120.

When the operation circuit (120 to 170) performs a program operation on the memory cells, a program permission voltage of 0V may be applied to a bit line of a selected memory string in a memory block. In addition, a turn-off voltage of, for example, 0V may be applied to a gate of a drain select transistor of an unselected memory string sharing the bit line. Off characteristics of the drain select transistor may be deteriorated by holes charged to a channel of the drain select transistor of the unselected memory string by Band to Band Tunneling (BTBT). Further, a channel boosting level may be reduced in a channel region of the unselected memory string, or i.e., a channel region of a program prohibition cell. When a back bias effect is improved by increasing the program permission voltage applied to the bit line, the off characteristics of the drain select transistor may be improved as a result.

The off characteristics of the drain select transistor may be improved by increasing a back bias effect by increasing the program permission voltage applied to the bit line. Furthermore, a program speed may also be improved by increasing a program voltage applied to the selected word line by as much as a bit line voltage is increased.

When the program voltage is further increased, a bias gap between neighboring word lines may be increased. In addition, program disturbance characteristics may be further deteriorated. Therefore, the reduction in program speed may be minimized. In addition, the off characteristics of the drain select transistor may be improved by increasing a program permission voltage applied to a bit line of a program target memory cell when the number of times a program loop is performed is greater than a reference number. For instance, the program permission voltage may be increased when the operation circuit (120 to 170) performs the program loop with a predetermined number left to reach a maximum number. Preferably, the program permission voltage applied to the bit line may be increased only in the last three loops. The last three loops may be among program loops using an Increment Step Pulse Program (ISPP) scheme.

In the program loops using the ISPP scheme, when the program permission voltage starts to be increased from the first loop, the program speed may be greatly reduced accordingly. However, when the program permission voltage is increased in only the last few loops, the program speed may be slightly reduced. In addition, program disturbance characteristics may be significantly improved.

Figure 3:
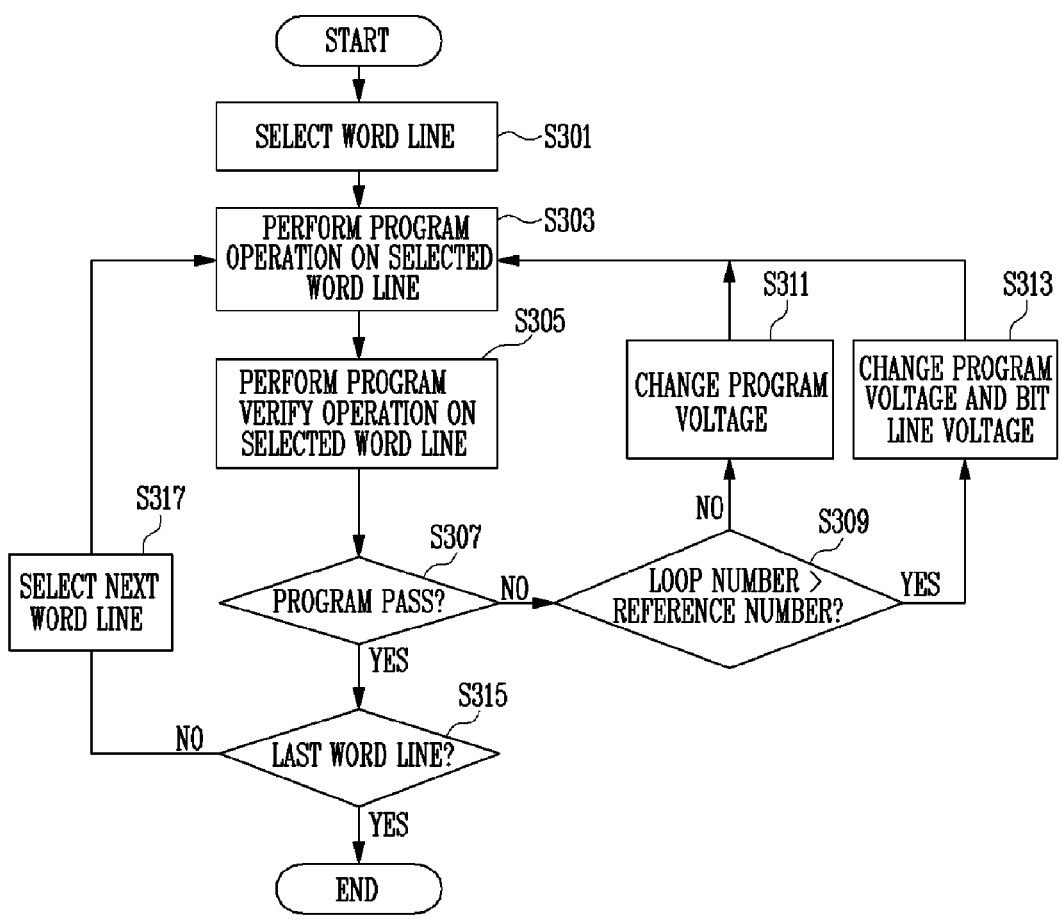
FIGS. 3 and 4 are flow charts illustrating methods of operating a semiconductor device according to embodiments of the invention.
Figure 4:
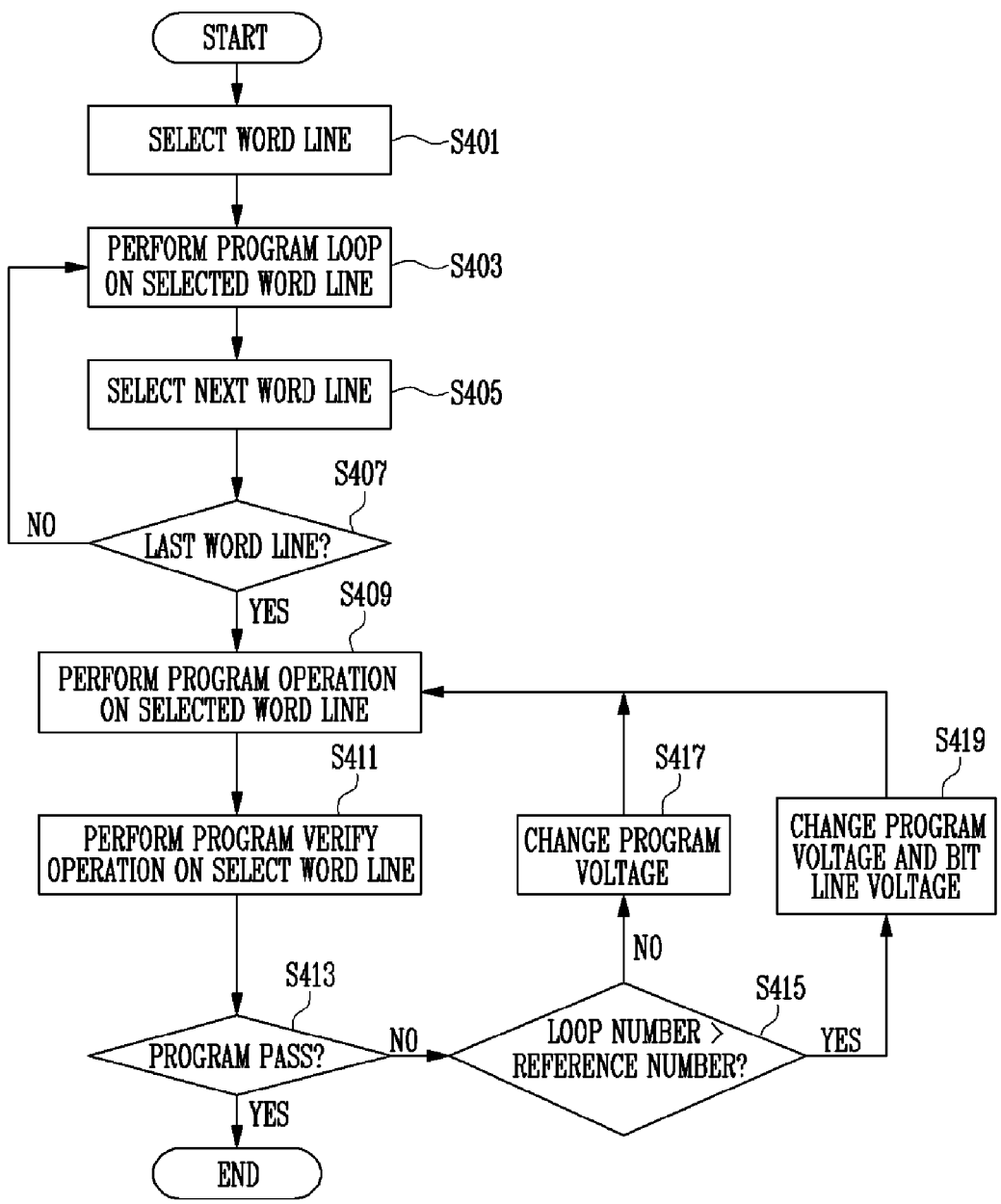
Figure 5:
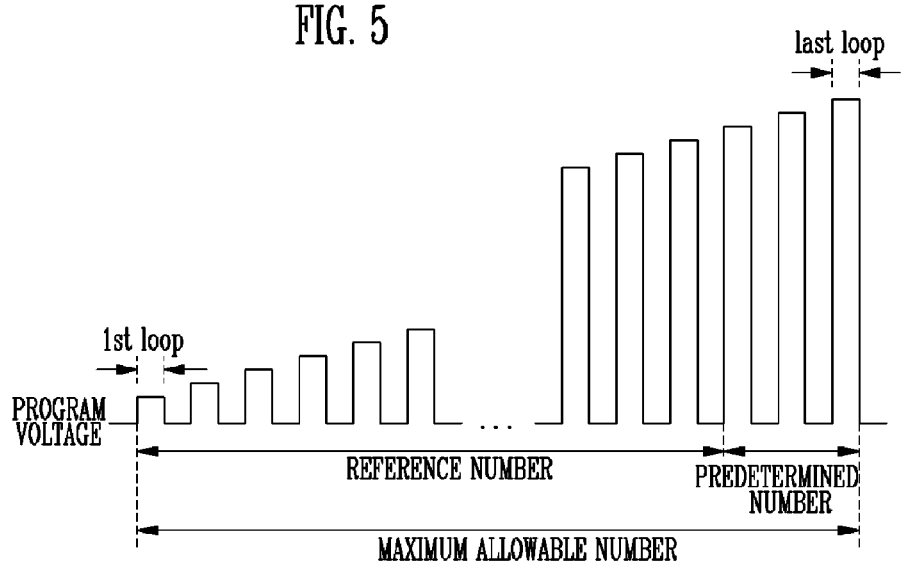
FIGS. 5 and 6 are waveform diagrams illustrating methods of operating a semiconductor device according to embodiments of the invention.
Figure 6:
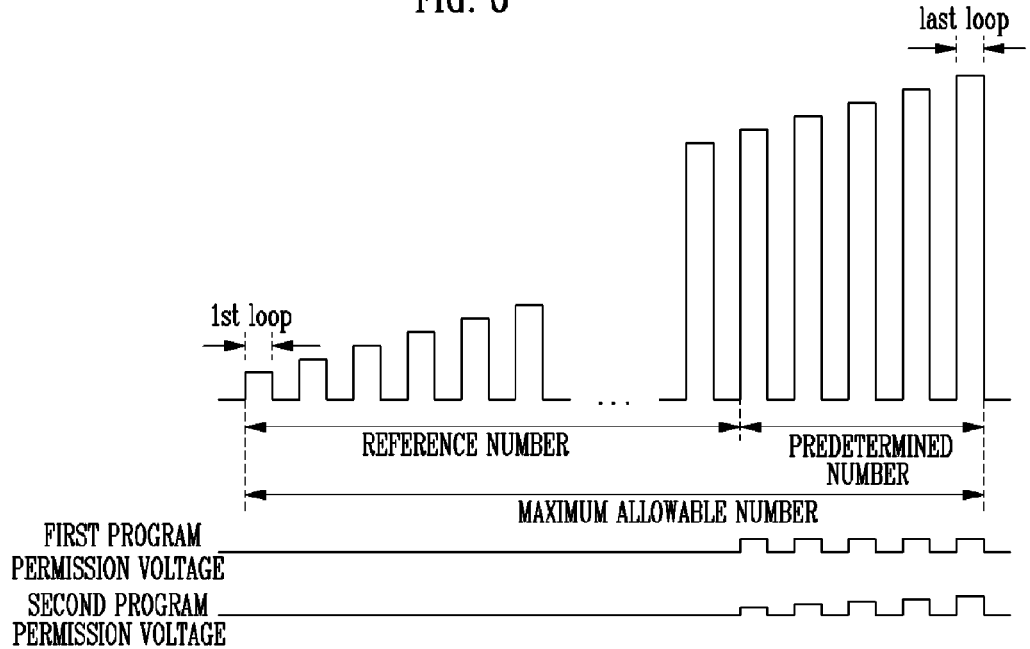

Operations of the above-described semiconductor device are described in detail below as FIGS. 3 and 4 are flow charts illustrating methods of operating a semiconductor device according to embodiments of the invention. FIGS. 5 and 6 are waveform diagrams illustrating methods of operating a semiconductor device according to embodiments of the invention.

Referring to FIGS. 3 and 5, a word line may be selected to perform a program operation at step S301. Generally, a first word line, the word line WL0 may be selected in the memory block.

A program loop may be performed on memory cells electrically coupled to the selected word line at steps S303 to S313. First, a program operation may be performed on the memory cells electrically coupled to the selected word line at step S303.

The operation circuit may apply a program permission voltage of, 0V to a bit line of a program target cell. The operation circuit may also apply a program inhibition voltage of, 2.3V to a bit line of a program prohibition cell. The operation circuit may apply a program voltage to a word line of the program target cell. Further, the operation circuit may apply a program pass voltage to other word lines.

Other memory strings may be electrically coupled to the bit line of the memory string including the program target cell in the memory block. In addition, memory strings that share the bit line in the memory block may also share word lines. Therefore, the program permission voltage, the program voltage and the program pass voltage may be equally applied to the memory strings that share the bit line. To perform a program operation only on the selected memory string and set the other memory strings to a program prohibition mode, the operation circuit may apply a voltage of 2V to turn on a drain select transistor to a drain select line of the selected memory string. The operation circuit may also apply a voltage of 0V to turn off the drain select transistor to drain select lines of unselected memory strings.

Accordingly, since a channel region of the selected memory string may remain grounded, a threshold voltage of the program target cell may be increased by a difference between a channel voltage and a program voltage. In addition, a channel region of the unselected memory strings may be in a floating state and channel boosting may then occur. The channel voltage may increase and the difference between the program voltage and the channel voltage may be reduced. The threshold voltage of the program prohibition cell may then not be increased as a result.

The operation circuit may be configured to perform a verify operation on the selected word line at step S305. The operation circuit may be configured to precharge the bit lines, apply a program verify voltage to the selected word line and apply a pass voltage to the other word lines. When the threshold voltage of the program target cell is higher than the target voltage, the bit line may then be discharged. When the threshold voltage of the program target cell is lower than the target voltage, the bit line may then remain precharged. The operation circuit may be configured to sense a voltage variation of the bit line and output a pass/fail result signal to the control circuit according to a sensing result.

The control circuit may be configured to determine program pass in response to the pass/fail result signal output from the operation circuit at step S307. More specifically, the control circuit may check whether threshold voltages of selected memory cells increase to a target level.

When the control circuit determines that the program operation is not successful, the control circuit may check whether a loop number counted by a loop counter, or i.e., the number of times the program operation is performed has exceeded a reference number at step S309.

At step S311, the operation circuit may be configured to change the program voltage and repeat steps S303 to S309 when the loop number is smaller than or equal to the reference number. The program voltage may be increased by a predetermined step voltage.

When the program operation continues to fail and the loop number exceeds the reference number, the operation circuit may be configured to change the program voltage applied to the selected word line and the program permission voltage applied to the bit line of the program target cell at step S313 and repeat steps S303 to S309. Further, the operation circuit may be configured to increase the program permission voltage when performing a program loop with a predetermined number left to reach a maximum number.

Even when the loop number increases, the operation circuit may be configured to apply the program permission voltage at a predetermined level, as in a first program permission voltage. In the alternative, the operation circuit may be configured to increase the program permission voltage in proportion to an increase in loop number, as in a second program permission voltage. The program permission voltage may be increased in a lower range than the program inhibition voltage applied to the bit line of the program prohibition cell.

When it is determined that the program operation is successful at step S307, it may then be checked whether the selected word line is the last word line in the memory block at step S315. When it is checked that the selected word line is not the last word line, the next word line may then be selected at step S317. Subsequently, steps S303 to S313 may also be repeated.

The reference number may be determined regardless of the order of the selected word line or a distance from the drain select line at step S309. In addition, the reference number may be reduced as the selected word line is closer to the last word line or the drain select line. More specifically, as the selected word line is closer to the last word line or the drain select line, the predetermined number may be increased.

When it is determined that the program operation of the last word line is successful, the program loop may then be terminated at step S315.

The program permission voltage may be increased when the program loop is performed with the predetermined number left to reach the maximum number. As a result, a program speed may be slightly reduced and program disturbance characteristics may be greatly improved.

As described above, the program permission voltage applied to the bit line may be changed when the loop number exceeds the reference number in a program loop of all word lines. However, the program permission voltage applied to the bit line may be changed when the loop number exceeds the reference number in a program loop of a few word lines adjacent to a drain select line. The program permission voltage applied to the bit line may be changed when the loop number exceeds the reference number in a program loop of the last word line. A detailed description thereof is described below.

Referring to FIG. 4, a word line may be selected to perform a program operation on at step S401. In general, a first word line, for example, the word line WL0 may be first selected in a memory block.

The operation circuit may perform a program loop on memory cells electrically coupled to the selected word line at step S403. The program loop may be performed by repeating the above-described operations at steps S303, S305, S307 and S311 in FIG. 3. However, even when the number of times the program loop is repeated exceeds the reference number, since the selected word line is not the last word line and is distant from the drain select line, the program permission voltage applied to the bit line may not be changed.

When it is determined that the program loop is successful, the operation circuit may select a next word line at step S403 and determine whether the selected word line is the last word line in the memory block at step S407. When the selected word line is not the last word line, the operation circuit may perform a program loop on the selected word line at step S403 and select a next word line at step S405.

When it is determined that the selected word line is the last word line at step S407, the operation circuit may perform the program loop by changing a program permission voltage of the bit line when the number of times the program loop is repeated exceeds the reference number as illustrated in FIG. 3. First, the operation circuit may perform a program operation on the memory cells electrically coupled to the selected word line at step S409. The program operation at step S409 may be performed in the same manner as the program operation at step S303.

The operation circuit may be configured to perform a verify operation on the selected word line at step S411. At step S411, the program verify operation may be performed in a similar manner as the program verify operation described at step S305 in FIG. 3. The operation circuit may be configured to output a pass/fail result signal to the control circuit according to a verify result.

The control circuit may be configured to determine program pass in response to the pass/fail result signal output from the operation circuit at step S413. More specifically, the control circuit may be configured to determine whether threshold voltages of the selected memory cells increase to a target level.

When it is determined that the program operation is not successful, the control circuit may be configured to determine whether a loop number counted by a loop counter (i.e., the number of times the program operation is performed) has exceeded a reference number at step S415. When the loop number is smaller than or equal to the reference number, the operation circuit may be configured to change a program voltage at step S417 and repeat steps S409 to S415. The program voltage may then be increased by a predetermined step voltage.

When the program operation continues to fail and the loop number exceeds the reference number, the operation circuit may be configured to change the program voltage applied to the selected word line and the program permission voltage applied to the bit line of the program target cell at step S419 and repeat steps S409 to S415. In addition, the operation circuit may be configured to increase the program permission voltage when the program loop is performed with the predetermined number left to reach the maximum number.

As illustrated in FIG. 6, even when the loop number increases, the operation circuit may be configured to apply the program permission voltage with a predetermined level as in the first program permission voltage. In the alternative, the operation circuit may be configured to increase the program permission voltage in proportion to the increase in loop number, as in the second program permission voltage. The program permission voltage may be increased in a lower range than the program inhibition voltage applied to the bit line of the program prohibition cell.

When it is determined that the program operation of the last word line is successful at step S413, the program loop may then be terminated.

A program speed may be slightly reduced and program disturbance characteristics may be greatly improved by increasing the program permission voltage when the program loop of the last word line is performed with the predetermined number left to reach the maximum number in the program loop of the last word line. In addition, since the program permission voltage may be changed according to the loop number in the program loop of the last word line, the program speed may as a result be prevented from being reduced in a program loop of previous word lines. Accordingly, the entire operation speed may be improved.

Figure 7:
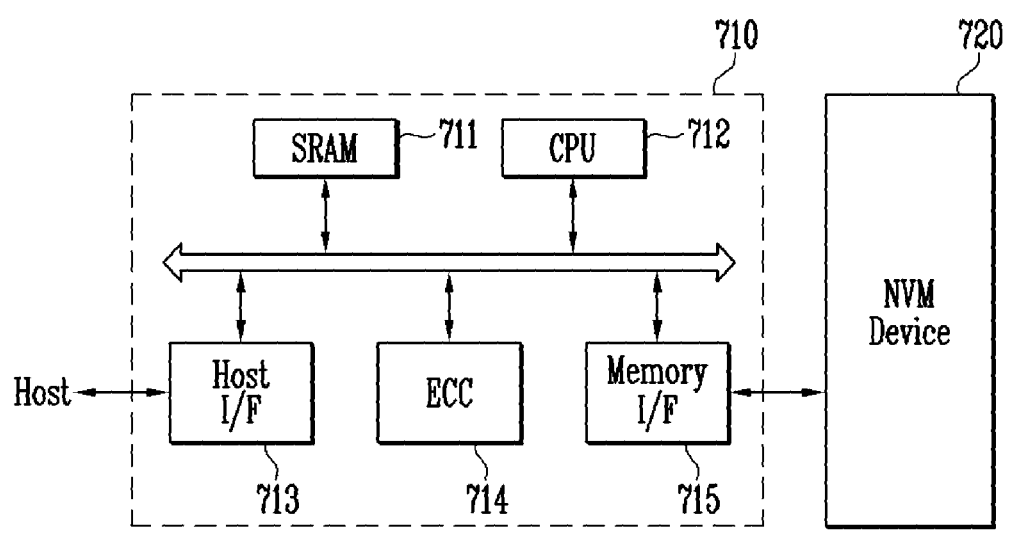
FIG. 7 is a schematic block diagram illustrating a memory system according to an embodiment of the invention.

Referring to FIG. 7, a block diagram illustrating a memory system according to an embodiment of the invention is shown.

As illustrated in FIG. 7, a memory system 700 according to an embodiment of the invention may include a non-volatile memory device 720 and a memory controller 710.

The non-volatile memory device 720 may include the above-described semiconductor memory. The memory controller 710 may be configured to control the non-volatile memory device 720. Since the memory controller 710 includes the non-volatile memory device 720 composed of the above-described semiconductor memory, operating characteristics may be improved as described above.

The memory controller 710 may be a solid state disk (SSD) or a memory card wherein the non-volatile memory device 720 and the memory controller 710 are combined. SRAM 711 may be configured to function as an operation memory of a processing unit 712. A host interface 713 may include a data exchange protocol of a host being electrically coupled to the memory system 700. An error correction block 714 may be configured to detect and correct errors included in a data read from the non-volatile memory device 720. A memory interface 714 may be configured to interface with the non-volatile memory device 720. The processing unit 712 may be configured to perform the general control operation for data exchange of the memory controller 710. FIG. 7 also illustrates a memory I/F 715.

Though not shown in FIG. 7, the memory system 700 may further include (read-only memory) ROM (not illustrated) that stores code data to interface with the host. In addition, the non-volatile memory device 720 may be a multi-chip package composed of a plurality of flash memory chips. The memory system 700 having the above-described configuration may be provided as a storage medium that has high reliability and low error rate. When a flash memory device according to an embodiment of the invention is provided in a memory system such as a semiconductor disk device (solid state disk (SSD)), the memory controller 710 may be configured to communicate with an external device (e.g., a host) through one of various interface protocols, such as USB, MMC, PCI-E, SATA, PATA, SCSI, ESDI and IDE.

Figure 8:
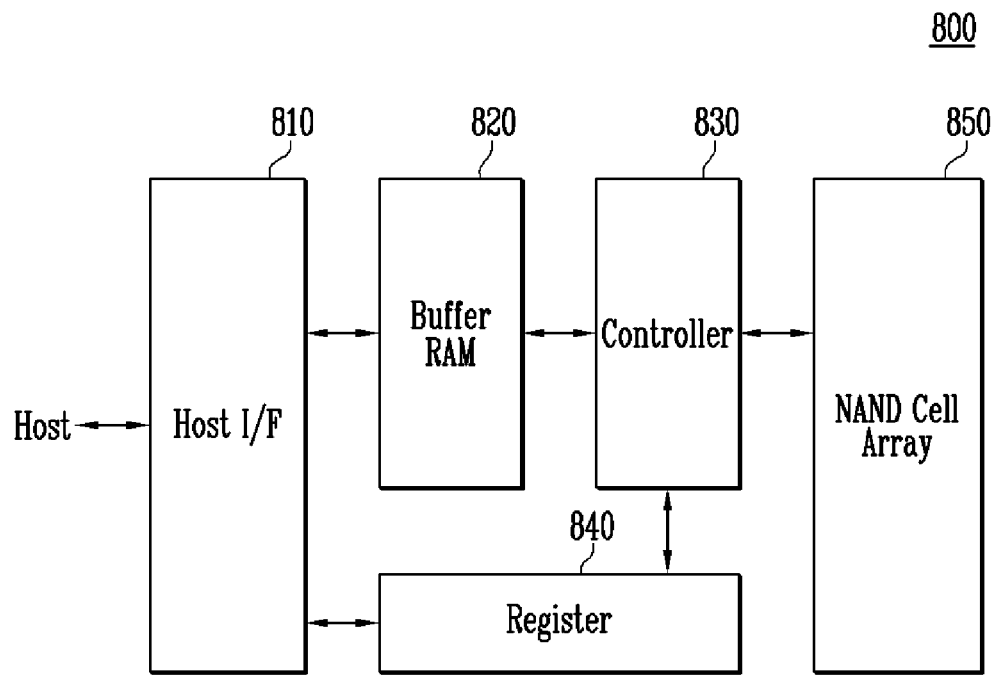
FIG. 8 is a block diagram illustrating a fusion memory device or a fusion memory system performing a program operation according to the above-described various embodiments of the invention.

Referring to FIG. 8, a block diagram illustrating a fusion memory device or a fusion memory system according to an embodiment of the invention is shown. For example, technical features of the invention may be applied to a OneNAND flash memory device 800 as a fusion memory device.

The OneNand flash memory device 800 may be configured to include a host interface (I/F) 810, a buffer RAM 820, a controller 830, a register 840 and a NAND flash cell array 850. The host interface 810 may be configured to exchange various types of information with a device using different protocols. The buffer RAM 820 may be loaded with codes to drive the memory device or temporarily store data. The controller 830 may be configured to control read and program operations at every state in response to a control signal and a command externally given. The register 840 may be configured to store data including instructions, addresses and configurations defining a system operating environment in the memory device. The NAND flash cell array 850 may include operating circuits that include non-volatile memory cells and page buffers. The memory array shown in FIG. 2 may be used as a memory array of the NAND flash cell array 850.

Figure 9:
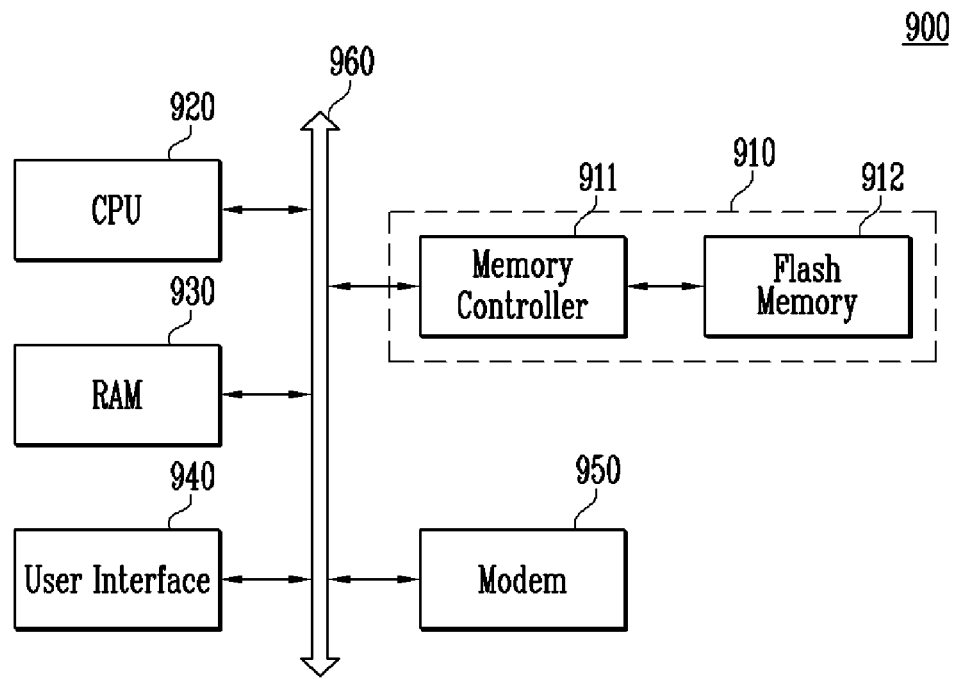
FIG. 9 is a block diagram illustrating a computing system including a flash memory device according to an embodiment of the invention.

Referring to FIG. 9, a block diagram illustrating a computing system according to an embodiment of the invention is shown. The computing system 900 may include a flash memory device 912.

The computing system 900 according to an embodiment of the invention may include a microprocessor 920, RAM 930, a user interface 940, a modem 950, such as a baseband chipset, and a memory system 910, that are all electrically coupled to a system bus 960. In addition, when the computing system 900 is a mobile device, a battery (not illustrated) may be further included to apply an operating voltage to the computing system 900. Though not shown in FIG. 9, the computing system 900 may further include application chipsets, a camera image processor (CIS) and mobile DRAM. The memory system 910 may be configured to form a solid state drive/disk (SSD) that uses a non-volatile memory device to store data. In the alternative, the memory system 910 may be provided as a fusion memory flash memory (e.g., OneNAND flash memory). FIG. 9 also illustrates a memory controller 911, a flash memory 912, and a modem 915.

According to an embodiment of the invention, operating characteristics may be improved.

Although the invention has been described with reference to certain embodiments thereof, it will be understood by those skilled in the art that a variety of modifications and variations may be made to the invention without departing from the spirit or scope of the invention defined in the appended claims, and their equivalents.

What is claimed is:

1. A semiconductor device, comprising:
   memory cells electrically coupled to word lines; and
   an operation circuit suitable for performing a program loop on memory cells electrically coupled to a selected word line, wherein the operation circuit is suitable for increasing a program permission voltage applied to a bit line of a program target memory cell when a number of times in which the program loop is performed exceeds a reference number.
   wherein the word lines are configured between a source select line and a drain select line, and
   the reference number increases as the selected word line is closer to the drain select line.

2. The semiconductor device of claim 1, wherein a memory block includes memory strings having a three-dimensional structure and each including a drain select transistor, the memory cells and a source select transistor electrically coupled vertically.

3. The semiconductor device of claim 2, wherein the operation circuit is suitable for applying a turn-on voltage to the drain select transistor of a selected memory string, and a turn-off voltage to the drain select transistors of unselected memory strings in the memory block.

4. The semiconductor device of claim 1, wherein the operation circuit is suitable for increasing the program permission voltage if the number of times the program loop is performed exceeds the reference number when the program loop is performed on a word line selected last from among the word lines.

5. The semiconductor device of claim 1, wherein the word lines are configured between a source select line and a drain select line, and
the operation circuit is suitable for increasing the program permission voltage if the number of times the program loop is performed exceeds the reference number when the program loop is performed on a word line adjacent to the drain select line.

6. The semiconductor device of claim 1, wherein the operation circuit is suitable for increasing the program permission voltage when the program loop is performed with a predetermined number left to reach a maximum number.

7. The semiconductor device of claim 1, wherein the operation circuit is suitable for increasing the program permission voltage in proportion to the number of times in which the program loop is performed.

8. The semiconductor device of claim 1, wherein the operation circuit is suitable for applying a program inhibition voltage to unselected bit lines when the program loop is performed and increasing the program permission voltage in a lower range in relation to a range of the program inhibition voltage.

9. A semiconductor device, comprising:
a memory block including memory strings having a three-dimensional structure, wherein each of the memory strings includes a drain select transistor, memory cells and a source select transistor electrically coupled in a vertical direction between a bit line and a common source line; and
an operation circuit suitable for performing a program loop on selected memory cells, and increasing a program permission voltage applied to the bit line of a program target memory cell when a number of times the program loop is performed exceeds a reference number,
wherein the reference number increases as the selected memory cell is closer to the drain select line.

10. The semiconductor device of claim 9, wherein the operation circuit is suitable for increasing the program permission voltage if the number of times the program loop is performed exceeds the reference number when the program loop is performed on a word line selected last from among the word lines.

11. The semiconductor device of claim 9, wherein the operation circuit is suitable for increasing the program permission voltage if the number of times the program loop is performed exceeds the reference number when the program loop is performed on a memory cell that is adjacent to the drain select transistor.

12. The semiconductor device of claim 9, wherein the operation circuit is suitable for increasing the program permission voltage when the program loop is performed with a predetermined number left to reach a maximum number.

13. The semiconductor device of claim 9, wherein the operation circuit is suitable for increasing the program permission voltage in relation to the number of times that the program loop is performed.

14. The semiconductor device of claim 9, wherein the operation circuit is suitable for applying a program inhibition voltage to an unselected bit line when the program loop is performed and increasing the program permission voltage applied to the bit line in a lower range in relation to a range of the program inhibition voltage.

* * * * *